(12) United States Patent
Miyazawa

(10) Patent No.: US 7,964,416 B2
(45) Date of Patent: Jun. 21, 2011

(54) MANUFACTURING METHOD OF ORGANIC EL DISPLAY

(75) Inventor: Kazutoshi Miyazawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/908,424

(22) Filed: Oct. 20, 2010

(65) Prior Publication Data

US 2011/0104842 A1    May 5, 2011

(30) Foreign Application Priority Data

Nov. 5, 2009  (JP) ................................ 2009-254199

(51) Int. Cl.
*H01L 51/00* (2006.01)
(52) U.S. Cl. .................. 438/4; 257/E51.018; 445/2
(58) Field of Classification Search ........... 257/E33.061, 257/E51.018–E51.022; 438/4, 29, 99; 445/2, 445/61
See application file for complete search history.

(56) References Cited

U.S. PATENT DOCUMENTS

| 7,701,133 B2 * | 4/2010 | Kajiyama et al. ............ 313/504 |
| 2004/0082252 A1 | 4/2004 | Liao et al. |
| 2005/0023523 A1 | 2/2005 | Kawaguchi et al. |
| 2005/0178072 A1 | 8/2005 | Olthoff |
| 2005/0202777 A1 | 9/2005 | Worland |
| 2005/0215163 A1 | 9/2005 | Tamura et al. |

FOREIGN PATENT DOCUMENTS

| JP | 11-54286 | 2/1999 |
| JP | 2004-119243 | 4/2004 |
| JP | 2004-227852 | 8/2004 |
| JP | 2005-276600 | 10/2005 |
| JP | 2008-235178 | 10/2008 |
| JP | 2009-16195 | 1/2009 |
| JP | 2009-140627 | 6/2009 |

* cited by examiner

*Primary Examiner* — Matthew Smith
*Assistant Examiner* — Daniel Shook
(74) *Attorney, Agent, or Firm* — Greenblum & Bernstein, P.L.C.

(57) ABSTRACT

Provided is a method of manufacturing an organic EL display which includes a substrate having a TFT therein and a plurality of organic EL elements disposed on the substrate, each of the organic EL elements having a first electrode disposed on the substrate, an organic layer disposed on the first electrode, and a second electrode disposed on the organic layer, the method including: providing the substrate having the TFT therein; forming the first electrode connected to the TFT on the substrate; forming the organic layer on the first electrode; detecting a foreign substance introduced in the organic layer; forming a groove which surrounds the foreign substance in the organic layer; and forming the second electrode on the organic layer, the second electrode being separated by the groove from a region surrounded by the groove.

8 Claims, 12 Drawing Sheets

PRIOR ART

MANUFACTURING METHOD OF ORGANIC EL DISPLAY

CROSS REFERENCE TO RELATED APPLICATIONS

This application is entitled and claims the benefit of Japanese Patent Application No. 2009-254199, filed on Nov. 5, 2009, the disclosure of which including the specification, drawings and abstract is incorporated herein by reference in its entirety.

TECHNICAL FIELD

This disclosure relates to luminescent displays having organic EL elements and other components, and manufacturing methods of the same.

BACKGROUND ART

As the next generation of flat displays, there have been growing expectations for organic EL displays that use organic electroluminescent (EL) elements. The organic EL display has the advantages of being self-light emitting and independent of view angle, as well as being capable of achieving high contrast, slimness, lightweight, and low power consumption.

Organic EL elements, a component of an organic EL display, are generally disposed on a glass substrate in a matrix pattern. Each of the organic EL elements includes a first electrode (anode), a second electrode (cathode), and an organic layer disposed between the first and second electrodes. The organic layer includes a light-emitting layer containing fluorescent molecules, a thin hole-transportable layer, and a thin electron-transportable layer, wherein the light-emitting layer is sandwiched between the hole-transportable layer and electron-transportable layer. Application of voltage between the anode and cathode of an organic EL element causes holes injected into the hole-transportable layer from the anode and electrons injected into the electron-transportable layer from the cathode to be recombined in the light-emitting layer, causing the light-emitting layer to emit light. The organic EL elements are generally protected against ambient atmosphere by a protective layer.

The organic layer's thickness and thickness uniformity thereof are important factors during manufacture of an organic EL display, as these factors greatly influence light emission efficiency and power consumption of organic EL displays.

Examples of forming methods of organic layers include, for example, inkjet printing wherein coating solutions of organic materials are applied (printed) onto necessary areas followed by drying the solutions, and vacuum deposition wherein a metallic mask is used to deposit organic layers at necessary areas exclusively. With these methods, foreign substances could be introduced into organic layers.

In the inkjet printing method, it is possible that during application of coating solutions of organic materials foreign substances attached to the inkjet nozzles fall and are introduced into the resultant organic layers, or that foreign substances located inside the inkjet printing machine are discharged and scattered to be introduced into the organic layers. On the other hand, with the vacuum deposition method, it is possible that foreign substances in the deposition source are splashed and introduced into organic layers, or that foreign substances scattered from the vacuum chamber's inner walls or metallic mask are introduced into the organic layers.

In particular, recent requirements for large-size displays have also led to the development of large-size organic EL displays. Whether inkjet printing or vacuum deposition is used for the formation of organic layers, the chances that foreign substances are undesirably introduced into the organic layers are high, triggering quality reductions in organic EL displays.

Unwanted introduction of foreign substances into the organic layer results in current leakage between the anode and cathode, thereby increasing power consumption. Moreover, since less current flows near the foreign substance in the organic layer, brightness unevenness occurs, and occasionally, light emission failure occurs in a region near the foreign substance.

Unwanted introduction of foreign substances into organic layers during manufacture of an organic EL display causes problems like short circuits in the organic EL elements. In order to avoid these problems methods have been proposed in which a defective organic EL element is repaired by insulating foreign substances introduced in the organic layer after manufacture of an organic EL display (see, e.g., Patent Literatures 1-8).

Patent Literature 1 discloses, as illustrated in FIG. 1, a method of destroying anode 2 at a region under foreign substance 6 by irradiation with femtosecond laser beam 12 using laser oscillator 13 so that multiphoton absorption exclusively occurs at the irradiated portion of anode 2. This reduces possible damages to regions other than the defective part, and prevents current leakage between the anode and cathode through the defective part.

Patent Literature 5 discloses, as illustrated in FIG. 2, a method of preventing current leakage by selectively destroying second electrode 4 by laser radiation in such a way that the destroyed portion surrounds foreign substance 6 so that the region in which foreign substance 6 is introduced is insulated. Specifically, the method disclosed by Patent Literature 5 involves destroying second electrode 4 at a region around foreign substance 6, to form electrode-destroyed part 14 that surrounds foreign substance 6.

Patent Literature 7 discloses a method of preventing current leakage by applying, after manufacture of a display, a laser beam of relatively low energy to the organic layer at a region around a foreign substance. Radiating a laser beam of relatively low energy to a region of the organic layer around the foreign substance eliminates the layer structure in that region, whereby the irradiated region of the organic layer becomes highly electrically resistive.

Other prevention methods of current leakage are also known in which a portion of the second electrode is destroyed by laser radiation in such a way as to surround a foreign substance so that the region in which the foreign substance is introduced is insulated (see, e.g., Patent Literatures 9 and 10).

However, the methods as disclosed by Patent Literatures 1-10, which involve laser radiation after the formation of the second electrode, cause damages to layers other than those in which foreign substances are introduced, e.g., an electron injection layer or electrodes, which may conversely cause more defects in the organic EL display by laser irradiation.

In order to overcome these drawbacks, methods have been proposed in which foreign substances are rendered harmless immediately after the formation of organic functional layers in which the foreign substances have been introduced (see, e.g., Patent Literatures 11 and 12).

Patent Literature 11 discloses a prevention method of current leakage by forming insulating layers that cover foreign substances introduced. Patent Literature 12 discloses a method of repairing organic EL elements by removing foreign substances, introduced in the organic layers, by laser radiation and applying coating solutions of organic materials into the space from which the foreign substances have been removed.

CITATION LIST

Patent Literature

PTL 1: Japanese Patent Application Laid-Open No. 2008-235178
PTL 2: U.S. Patent Application Publication No. 2004/0082252
PTL 3: U.S. Patent Application Publication No. 2005/0023523
PTL 4: U.S. Patent Application Publication No. 2005/0178072
PTL 5: Japanese Patent Application Laid-Open No. 2005-276600
PTL 6: U.S. Patent Application Publication No. 2005/0215163
PTL 7: Japanese Patent Application Laid-Open No. 2004-227852
PTL 8: U.S. Patent Application Publication No. 2005/0202777
PTL 9: Japanese Patent Application Laid-Open No. 2009-140627
PTL 10: Japanese Patent Application Laid-Open No. 2009-016195
PTL 11: Japanese Patent Application Laid-Open No. H11-54286
PTL 12: Japanese Patent Application Laid-Open No. 2004-119243

SUMMARY OF INVENTION

Technical Problem

However, since the method disclosed by Patent Literature 11 entails formation of insulating layers over foreign substances, the surfaces corresponding to the foreign substances are considerably raised. This makes it difficult to form functional layers on the insulating layers. In particular, the raised surfaces cause cracking and/or rupture of the protective layer disposed on the second electrode. Cracking and/or rupture of the protective layer preclude protection of the organic layers against oxygen and water, facilitating degradation of the organic layers.

Moreover, since the method disclosed by Patent Literature 11 requires additional steps of forming a resist, which is used to form insulating layers that insulate foreign substances, and exposing and developing the resist, the manufacturing process becomes complicated and therefore manufacturing costs increase.

With the method disclosed by Patent Literature 12, however, there is a fear that pieces of foreign substance broken by laser radiation are scattered in the device to cause additional defects.

The present invention has been accomplished in view of the foregoing problems pertinent in the art, and an object of the present invention is therefore to provide a manufacturing method of an organic EL display, wherein defective organic EL elements are repaired without destroying foreign substances.

Solution to Problem

[1] A method of manufacturing an organic EL display which includes a substrate having a TFT therein and a plurality of organic EL elements disposed on the substrate, each of the organic EL elements having a first electrode disposed on the substrate, an organic layer disposed on the first electrode, and a second electrode disposed on the organic layer, the method including:
 providing the substrate having the TFT therein;
 forming the first electrode connected to the TFT on the substrate;
 forming the organic layer on the first electrode;
 detecting a foreign substance introduced in the organic layer;
 forming a groove which surrounds the foreign substance in the organic layer; and
 forming the second electrode on the organic layer, the second electrode being separated by the groove from a region surrounded by the groove.

[2] The manufacturing method according to [1] above, wherein the depth of the groove is larger than the thickness of the second electrode.

[3] The manufacturing method according to [1] or [2] above, wherein the width of the groove is larger than the thickness of the second electrode.

[4] The manufacturing method according to any one of [1] to [3] above, wherein wall surfaces of the groove are perpendicular to the substrate.

[5] The manufacturing method according to any one of [1] to [3] above, wherein wall surfaces of the groove are inclined with respect to the substrate.

[6] The manufacturing method according to any one of [1] to [3] above, wherein the groove has a reverse tapered shape.

[7] The manufacturing method according to any one of [1] to [6] above, wherein the groove is formed by ablating a portion of the organic layer by laser radiation.

[8] The manufacturing method according to any one of [1] to [7] above, wherein the second electrode is formed by vapor deposition or sputtering.

Advantageous Effects of Invention

With a manufacturing method of an organic EL display according to an embodiment of the present invention, it is possible to insulate foreign substances introduced in organic layers without destroying the foreign substances. It is thus possible to provide a high-yield manufacturing method of an organic EL display panel, which can repair defective organic EL elements without causing additional defects.

DESCRIPTION OF EMBODIMENTS

This disclosure relates to a manufacturing method of an organic EL display. An organic EL display manufactured with a manufacturing method according to an embodiment includes at least a substrate having thin film transistors (TFTs) therein, and organic EL elements disposed on the substrate in a matrix pattern.

For the substrate, glass substrates are often used. Alternatively, resin sheets or films can be employed. The organic EL element includes at least a first electrode disposed on the substrate, an organic layer disposed on the first electrode, and a second electrode disposed on the organic layer. The first electrode typically functions as an anode, but may function as a cathode. The second electrode typically functions as a cathode, but may function as an anode. Hereinafter, the first and second electrodes will also be referred to as "anode" and "cathode", respectively.

The organic layer includes at least an organic light-emitting layer, but may optionally include additional layers such as a hole injection layer, a hole transport layer, an electron transport layer, etc. The organic EL element may also include optional members such as a color filter and/or sealing film. The size and shape of the organic EL element can be determined depending on the characteristics (e.g., display resolution) required.

Figure 1:
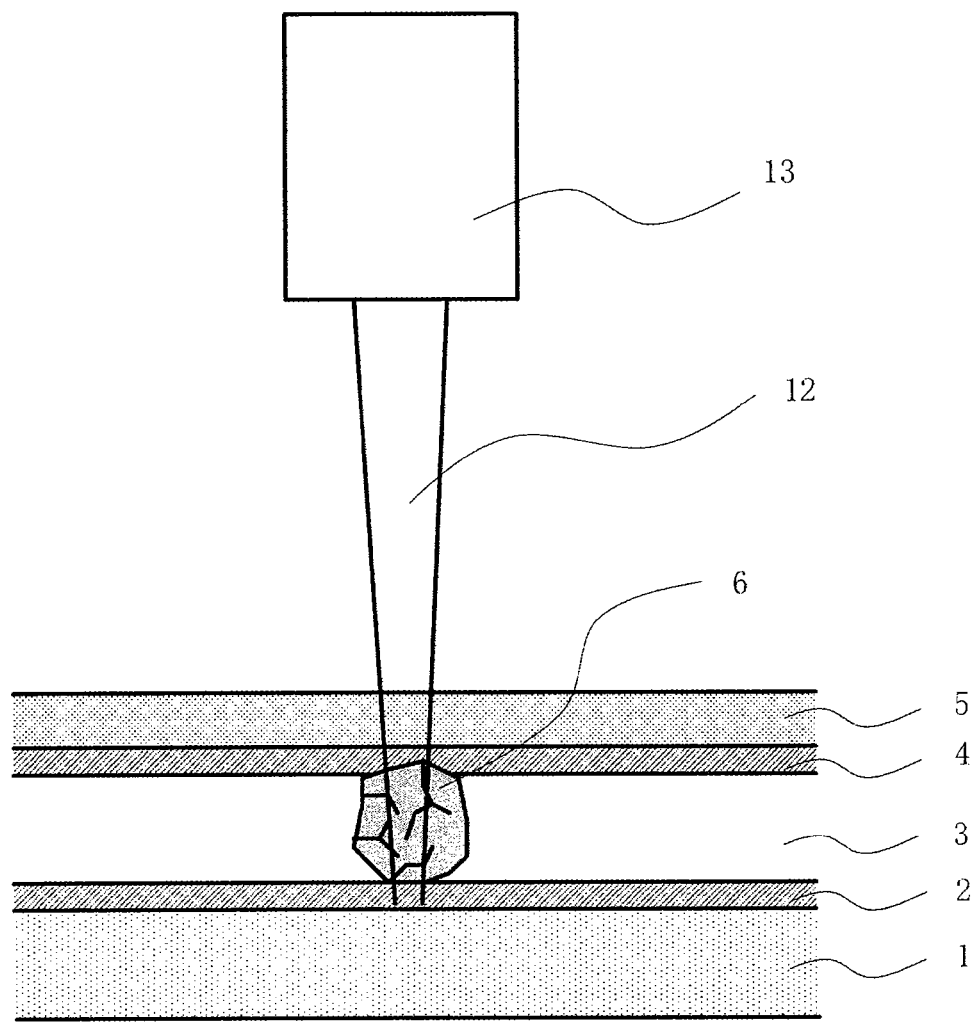
FIG. 1 illustrates a method disclosed by Patent Literature 1 in which a laser beam is applied to a foreign substance.
Figure 2:
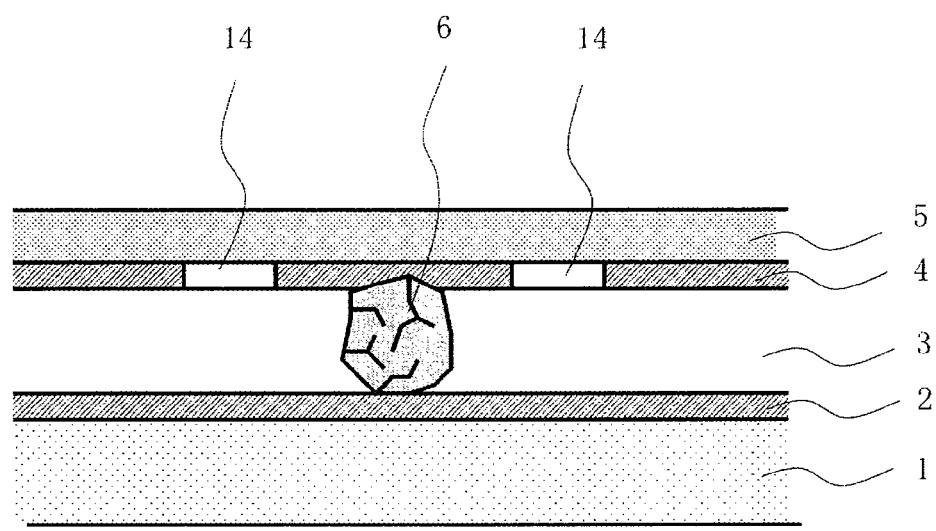
FIG. 2 illustrates a method disclosed by Patent Literature 2 in which an electrode is destroyed at a region around a foreign substance.
Figure 3:
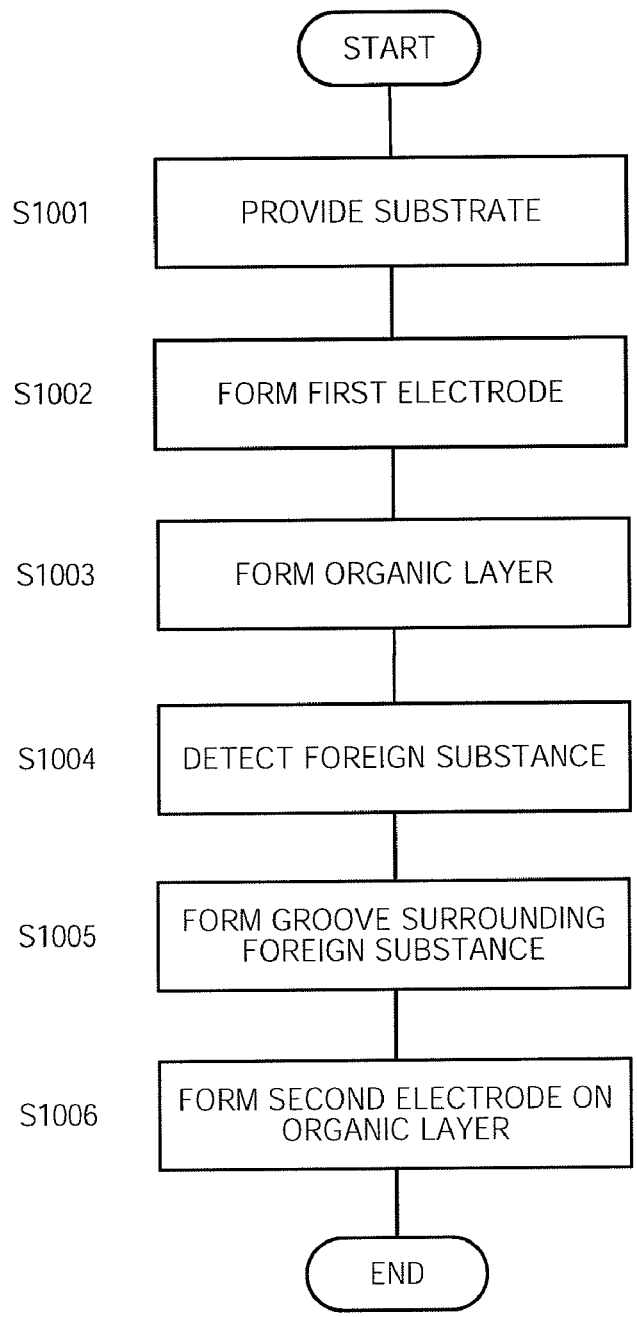
FIG. 3 is a flow chart of a manufacturing method of an organic EL display according to an embodiment of the present invention.

As illustrated in the flowchart of FIG. 3, a manufacturing method of an organic EL display according to an embodiment includes:

1) first step of providing a substrate having a TFT therein (S1001);

2) second step of forming a first electrode connected to the TFT on the substrate provided in the first step (S1002);

3) third step of forming an organic layer on the first electrode formed in the second step (S1003);

4) fourth step of detecting a foreign substance in the organic layer formed in the third step (S1004);

5) fifth step of forming a groove in the organic layer so as to surround the foreign substance detected in the fourth step (S1005); and 6) sixth step of forming a second electrode on the organic layer after the fifth step (S1006).

The manufacturing method according to an embodiment is thus characterized in that, rather than removing a foreign substance introduced in an organic layer, a groove that surrounds the foreign substance is formed in the organic layer. The following describes each step in detail.

In the first step, a substrate having thin film transistors (TFT) therein is provided. The TFT provided in the substrate serves to drive first electrode.

There are no particular limitations to the substrate to be employed as long as it is electrically insulating as well as has desired transparency and mechanical properties. Typically, glass plates are often used. The substrate may be subjected to surface treatment such as plasma treatment or UV treatment.

In the second step, first electrodes connected to the respective TFTs are formed on the substrate provided in the first step (S1001). The first electrodes can be formed by depositing a film of first electrode material onto the substrate by sputtering and patterning the deposited film by etching.

In the third step, organic layers are formed on the respective first electrodes formed in the second step. The formation method of the organic layers is appropriately determined depending on the nature of the organic layer materials employed. For example, when polymer organic layer materials are used, organic layers are often formed by applying coating solutions of the organic layer materials by inkjet printing or dispensing. The kinds of polymer organic layer materials and solvents are appropriately determined depending on the kind, characteristics, etc., of organic layers to be formed. Examples of polymer organic materials include polyfluorene-based polymer organic materials. When low-molecular weight materials are used, organic layers can be formed by vapor deposition or the like.

When polymer organic layer materials are used, organic layers are formed by coating method. Thus, in this case, banks that define regions to be coated with coating solutions of organic layer materials are previously formed on the substrate. The banks may define an organic layer for each organic EL element, or may define linear regions in which multiple organic EL elements are disposed. A set of organic EL elements arranged in one linear region emits the same color of light: red, green or blue.

There are no particular limitations to the materials of the bank; however, it is preferable to employ acrylic resins, polyimide resins or novolac phenol resins from the view point of imparting insulating property, organic solvent resistance, and process resistance (i.e., resistance to plasma treatment, etching treatment, and baking treatment). It is also possible to employ fluorine resins such as acrylic fluorine resins or polyimide fluorine resins. The lyophilicity or lyophobicity of the bank surface may be optionally adjusted by surface treatment such as plasma treatment or UV treatment.

The organic EL element is formed by lamination of thin films of electrodes and organic layers, with their thickness adjusted on the order of several nanometers to several tens of nanometers. Even when the manufacturing environment is strictly controlled or careful maintenance is made for manufacturing equipment, foreign substances derived from the equipment or surrounding atmosphere are occasionally introduced into the organic layers being formed. The foreign substances introduced into the organic layers cause current leakage.

Figure 4:
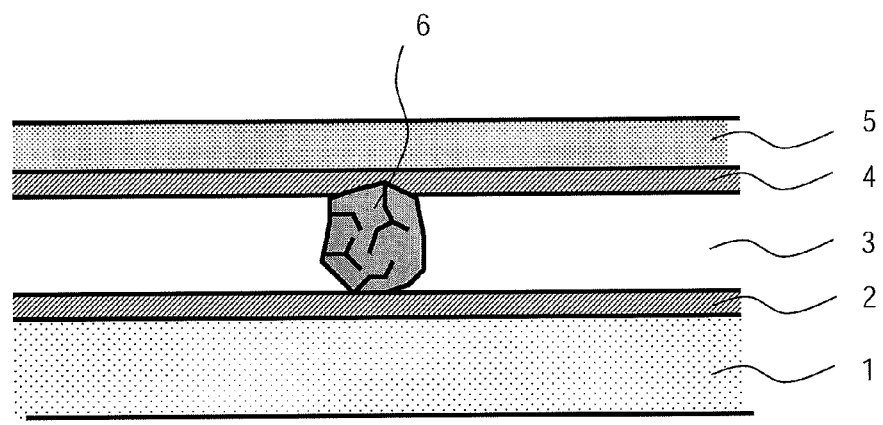
FIG. 4 is a cross-sectional view of an organic EL element in which a foreign substance is introduced in an organic layer.

FIG. 4 is a cross-sectional view of an organic EL element having an organic layer in which a foreign substance is introduced. As illustrated in FIG. 4, the organic EL element includes substrate 1, first electrode 2 disposed on substrate 1, organic layer 3 disposed on first electrode 2, second electrode 4 disposed on organic layer 3, and protective layer 5 disposed on second electrode 4. Foreign substance 6 is introduced into organic layer 3.

Because foreign substance 6 is in contact with both first electrode 2 and second electrode 4 as illustrated in FIG. 4, foreign substance 6 serves as a current leak path. For this reason, application of voltage between first electrode 2 and second electrode 4 results in the leakage of current from first electrode 2 to second electrode 4 via foreign substance 6, which leads to increased power consumption, non-uniform luminescence intensity due to reduced brightness around the foreign substance, and defects such as complete loss of luminescence.

In the fourth step, the organic layers formed in the third step are checked for any foreign substances introduced. There are no particular limitations to the detection methods of foreign substances in the organic layers; examples of such methods include visual inspection with a microscope, image inspection method, and pattern inspection method. Examples of image inspection method and pattern inspection method include "die-to-die inspection mode" that compares adjacent chips for the detection of foreign substances, and "die-to-database inspection mode" that compares a chip with design data for the detection of foreign substances. When any foreign substance has been detected, the process proceeds to the fifth step to insulate the foreign substance. When no foreign substance has been detected, on the other hand, the process skips the fifth step and proceeds to the sixth step.

In the fifth step, a portion of the organic layer around the foreign substance detected in the fourth step is removed to form a groove that surrounds the foreign substance. The wall surfaces of the groove may be either perpendicular (see Embodiment 1) or inclined (see Embodiment 2) with respect to the substrate surface. The groove may be a reverse tapered groove (see Embodiment 3). Herein, the term "reverse tapered groove" means a groove whose opening is smaller in width than the bottom surface.

The groove depth is larger than the thickness of the second electrode to be formed in the subsequent sixth step (later described). When additional functional layer(s), e.g., an electron injection layer are provided between the organic layer and second electrode, the groove depth is set larger than the total thickness of the second electrode and additional functional layer(s). The groove width is preferably larger than the thickness of the second electrode to be formed in the sixth step. As will be described later, setting the groove depth and groove width larger than the thickness of the second electrode facilitates division of the second electrode by the groove.

There are no particular limitations to the methods of forming a groove in an organic layer for surrounding a foreign substance; a laser beam can be radiated to the organic layer. By laser irradiation (laser ablation), the organic layer can be ablated in any size or shape. Herein, "a laser beam is radiated to an organic layer" means that a laser beam is radiated while being focused onto or near the organic layer.

There are no particular limitations to the laser source; for example, flashlamp-pumped Nd:YAG lasers can be employed. When such a Nd:YAG laser is used, the laser wavelength can be selected from 1,064 nm (fundamental harmonic), 532 nm (second harmonic), 355 nm (third harmonic), and 266 nm (fourth harmonic).

The wavelength of the laser radiated to the organic layer is not particularly limited as long as the organic layer can absorb the light; however, it is preferably 1,100 nm or less, most preferably 400 nm or less. Specifically, when the above Nd:YAG laser is used, it is preferable to select the third harmonic (355 nm) or the fourth harmonic (266 nm). This is because smaller wavelength leads to lesser adverse influences on the layers provided under the organic layer, e.g., substrate, anode or other organic layers (see Japanese Patent Application Laid-Open No. 2002-124380). The energy density of the laser radiated to the organic layer is appropriately determined depending on the material or thickness of the organic layer.

The laser radiation area is preferably adjusted in accordance with the size of a groove to be formed. The laser radiation area is adjusted by controlling the opening area of the slit.

By adjusting the laser spot shape or laser beam intensity in this way, it is possible to form a groove of desired shape.

Figure 5:
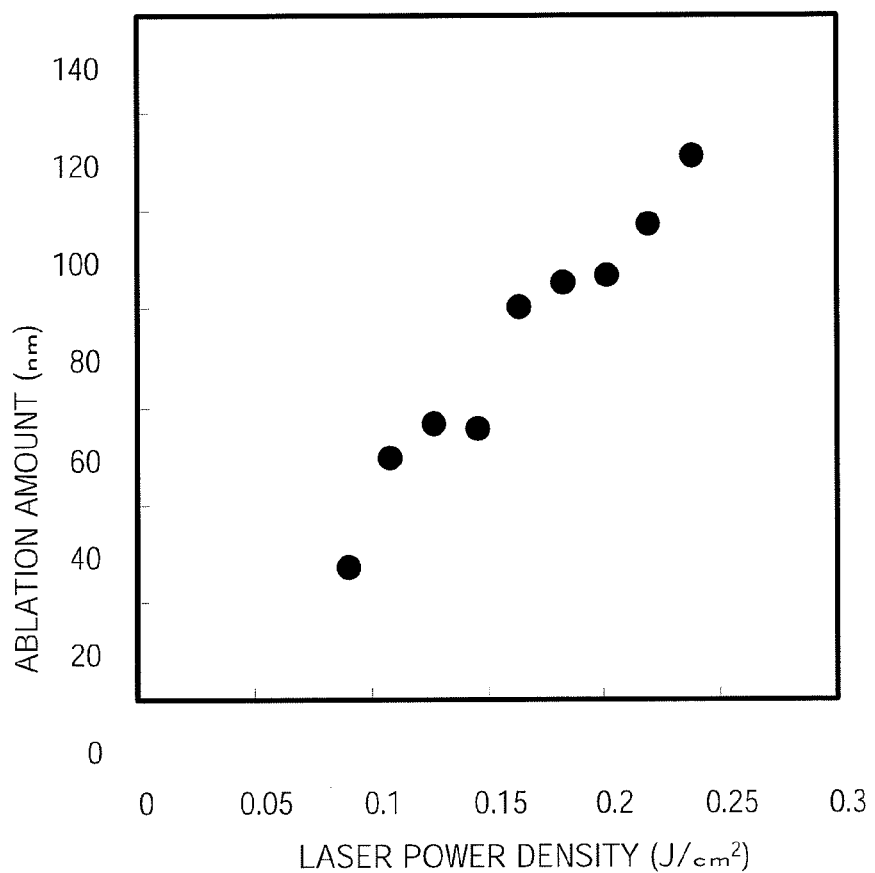
FIG. 5 is a graph of ablation amount of organic layer vs. laser energy density.

FIG. 5 is a graph of ablation amount of organic layer against laser energy density ranging from 0.09 to 0.24 J/cm$^2$, as measured in a preliminary experiment. In this experiment, third harmonic (355 nm) laser beams with different energy densities were applied to an organic light-emitting layer (polyfluorene-based polymer organic material; thickness=140 nm) formed on a glass substrate, measuring the depths of respective grooves formed by laser radiation in the organic light-emitting layer. As a laser source, QuickLaze-50ST2 (YAG laser, New Wave Research, Inc.) was employed. A single-shot laser ablation was carried out, with the laser radiation area on the organic light-emitting layer surface set to 50 μm, and pulse width set to 3-5 nanoseconds As can be seen in FIG. 5, there is a proportional relationship between laser energy density and groove depth. Thus, it can be learned that the depth of a groove formed in an organic layer can be adjusted on the order of several tens of nanometers by controlling the laser energy density.

In the sixth step, after the formation of a groove that surrounds a foreign substance in the organic layer in the fifth step, a second electrode is formed on the organic layer. The second electrode is separated by the groove from the region surrounded by the groove. The second electrode is formed by vapor deposition, sputtering or the like. Additional functional layer(s) such as an electron injection layer may be provided between the organic layer and second electrode.

As described above, the organic layer is provided with a groove that surrounds a foreign substance. In addition, the groove depth is made larger than the thickness of the second electrode. Thus, when the second electrode is formed on the organic layer, the second electrode and the region surrounded by the groove are separated by the groove, whereby the region separated by the groove is insulated (see FIG. 8). This enables to electrically insulate the foreign substance.

In this way, it is possible with the present invention to insulate foreign substances without destroying them, thereby preventing the generation of additional defects caused by scattered pieces of the foreign substances as well as the occurrence of short circuits in the organic EL elements caused by the foreign substances. Accordingly, according to the present invention, organic EL displays which are less power consumption by virtue of reduced current leakage and less brightness unevenness can be manufactured at high yields.

With reference to the drawings, manufacturing methods according to some embodiments will be described below, which however shall not be construed as limiting the invention thereto.

Embodiment 1

Embodiment 1 will describe a manufacturing method where the wall surfaces of a groove formed around a foreign substance are made perpendicular to the substrate. Moreover, Embodiment 1 is directed to a manufacturing method where organic layers are formed by coating method.

The manufacturing method according to Embodiment 1 includes 1) first step of forming a bank on a substrate on which a first electrode is disposed; 2) second step of forming an organic layer; 3) third step of detecting a foreign substance introduced into the organic layer; 4) fourth step of forming a groove in the organic layer so as to surround the foreign substance; and 5) fifth step of forming a second electrode on the organic layer.

In the first step, linear banks that define organic layers are formed on a substrate. In the second step, by means of inkjet printing, coating solutions of organic materials are applied into the regions defined by the banks formed in the first step, to form organic layers. In the third step, using an image inspection device, the organic layers are checked for foreign substances.

Figure 6:
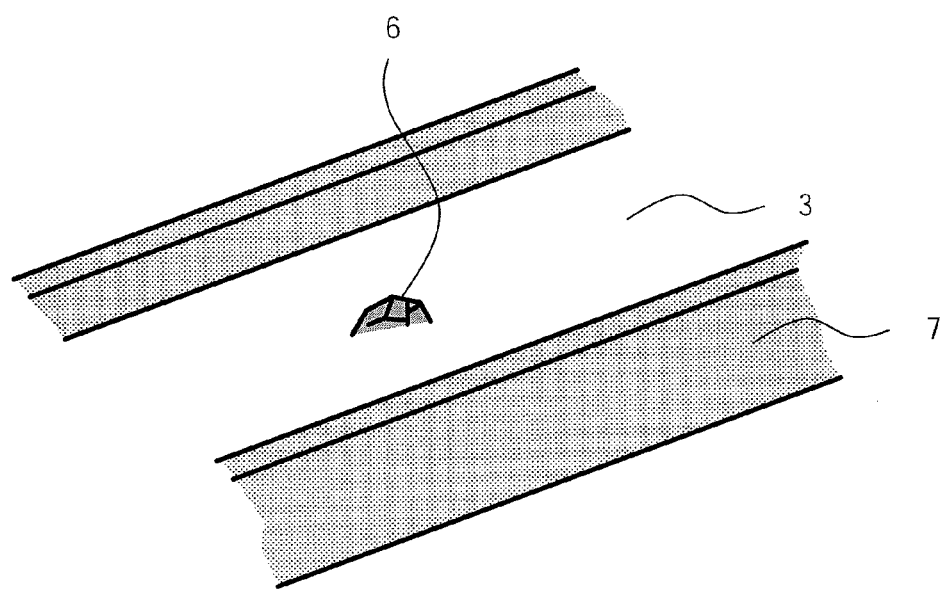
FIG. 6 is a perspective view of an organic layer in which a foreign substance is introduced.

FIG. 6 is a perspective view of a foreign substance detected in the third step. As illustrated in FIG. 6, foreign substance 6 is introduced into organic layer 3 formed in the region defined by banks 7.

In the fourth step, a laser beam is radiated to the organic layer around the foreign substrate detected in the third step. To achieve this, lines of laser beam may be independently radiated to the organic layer in such a way as to define each side of a region in which the foreign substance is located, or a laser beam point may be continuously moved on the organic layer in such a way as to surround the foreign substance. The intensity of the laser beam radiated to the organic layer is determined with reference to the result of a preliminary experiment (see FIG. 5) so that the depth of a groove to be formed becomes larger than the thickness of the second electrode to be formed on the organic layer in the fifth step.

There are no particular limitations to the laser source; for example, flashlamp-pumped Nd:YAG lasers or semiconductor lasers can be employed.

Figure 7:
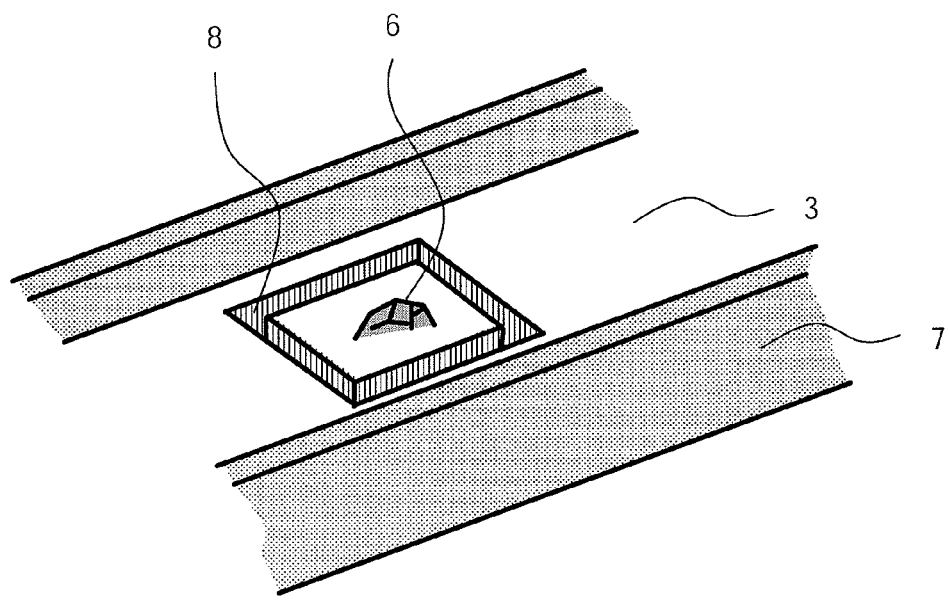
FIG. 7 is a perspective view of a groove that surrounds a foreign substance, the groove formed in an organic layer using the manufacturing method according to Embodiment 1.

As illustrated in FIG. 7, radiation of a laser beam to organic layer 3 around foreign substance 6 ablates portions of organic layer 3 around foreign substance 6, whereby groove 8 that surrounds foreign substance 6 is formed in organic layer 3.

After the fourth step, a second electrode is formed on the organic layer in the fifth step. As described above, the organic layer is provided with a groove which surrounds a foreign substance and whose depth is larger than the thickness of the second electrode. Thus, the second electrode is separated by groove 8 from the region surrounded by groove 8.

Figure 8:
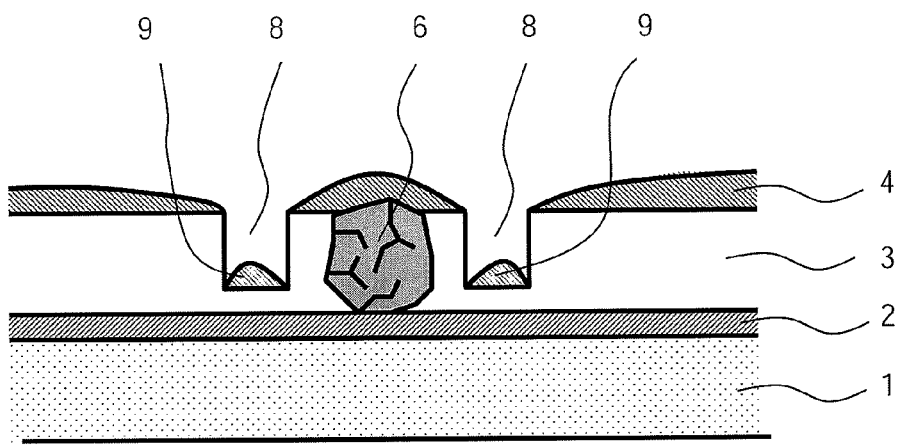
FIG. 8 is a cross-sectional view of a part of an organic EL display in which a foreign substance is introduced, the organic EL display manufactured using the manufacturing method according to Embodiment 1.

FIG. 8 is a cross-sectional view of an organic EL element around a foreign substance after the fifth step. As illustrated in FIG. 8, second electrode 4 is separated by groove 8 that surrounds foreign substance 6. Material 9 of second electrode 4 is deposited onto the bottom of groove 8. As second electrode 4 is separated by groove 8 from the region surrounded by groove 8 in this way, the electrode material on foreign substance 6 is insulated. Thus, when voltage is applied between the first and second electrodes, no current flows through the electrode material on the foreign substance, and therefore, current leakage via the foreign substance does not occur.

As explained above, the manufacturing method of an organic EL display according to Embodiment 1 can prevent current leakage via foreign substances introduced into the organic layers, by insulating the foreign substances without destroying them.

Embodiment 2

In Embodiment 1, a manufacturing method where the wall surfaces of a groove surrounding a foreign substance are perpendicular to the substrate has been described. Embodiment 2 will describe a manufacturing method where the wall surfaces of a groove are inclined with respect to the substrate surface.

As with the manufacturing method according to Embodiment 1, a manufacturing method of an organic EL display according to Embodiment 2 includes 1) first step of forming a bank on a substrate on which a first electrode is disposed; 2) second step of forming an organic layer; 3) third step of detecting a foreign substance introduced into the organic layer; 4) fourth step of forming a groove in the organic layer so as to surround the foreign substance; and 5) fifth step of forming a second electrode on the organic layer. The manufacturing method according to Embodiment 2 is identical to that of Embodiment 1 except for the fourth step. Accordingly, only the fourth step of the manufacturing method according to Embodiment 2 will be described.

In the fourth step of Embodiment 2, a groove which surrounds a foreign substance and whose wall surfaces are inclined with respect to the substrate surface is formed in the organic layer. In Embodiment 2, it is preferable that the wall surfaces of a groove be inclined at 45° or more with respect to the normal of the substrate surface.

Figure 9:
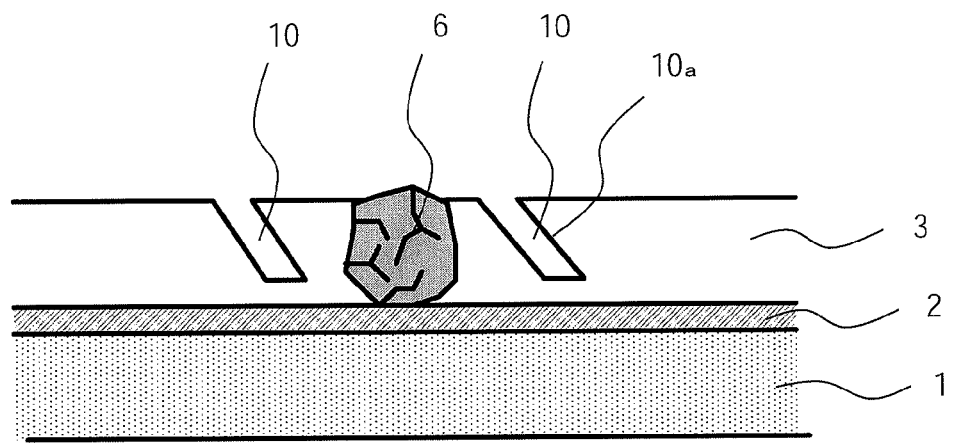
FIG. 9 is a cross-sectional view of a groove that surrounds a foreign substance, the groove formed in an organic layer using the manufacturing method according to Embodiment 2.

FIG. 9 is a cross-sectional view of an organic layer after the fourth step of Embodiment 2. As illustrated in FIG. 9, wall surfaces 10a of groove 10 surrounding foreign substance 6 are inclined with respect to the substrate surface.

Formation of a groove whose wall surfaces are inclined with respect to the substrate surface in the organic layer can be achieved for instance by radiating a laser beam at an angle with respect to the substrate surface. This can be achieved by inclining either the laser oscillator or the substrate. By inclining the wall surfaces of a groove with respect to the substrate surface in this way, it is possible to avoid deposition of electrode materials on one of the opposed wall surfaces of the groove during formation of the second electrode in the fifth step.

Figure 10:
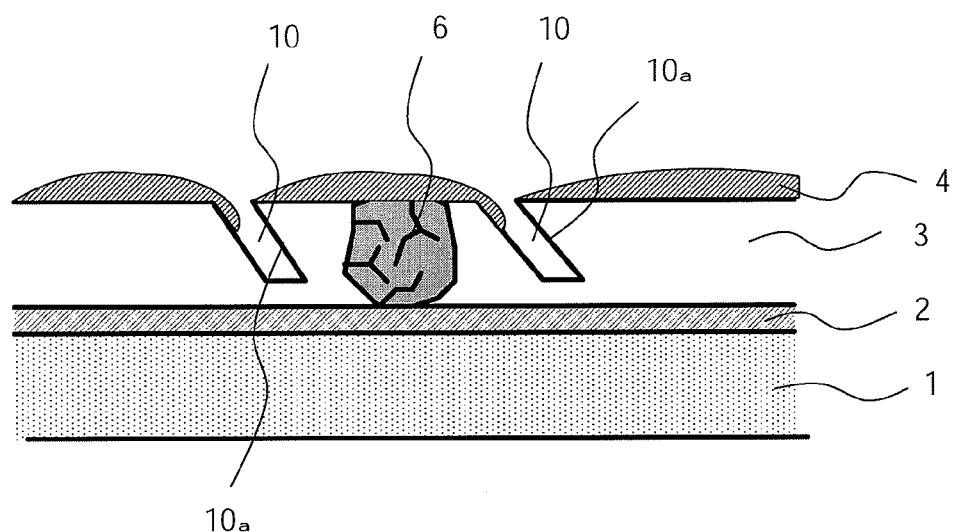
FIG. 10 is a cross-sectional view of a part of an organic EL display in which a foreign substance is introduced, the organic EL display manufactured using the manufacturing method according to Embodiment 2.

FIG. 10 is a cross-sectional view of an organic EL element around a foreign substance after the fifth step. As illustrated in FIG. 10, second electrode 4 is separated by groove 10 from the region surrounded by groove 10. Moreover, second electrode materials do not deposit onto wall surfaces 10a of groove 10. It is thus possible to insulate the region surrounded by groove 10 more reliably.

With the manufacturing method according to Embodiment 2, the region surrounded by a groove can be insulated more reliably than with the manufacturing method according to Embodiment 1. It is thus possible with the manufacturing method according to Embodiment 2 to prevent current leakage via foreign substances more reliably.

Embodiment 3

Embodiment 3 will describe a manufacturing method in which a groove surrounding a foreign substance has a reverse tapered shape.

As with the manufacturing method according to Embodiment 1, a manufacturing method of an organic EL display according to Embodiment 3 includes 1) first step of forming a bank on a substrate on which a first electrode is disposed; 2) second step of forming an organic layer; 3) third step of detecting a foreign substance introduced into the organic layer; 4) fourth step of forming a groove in the organic layer so as to surround the foreign substance; and 5) fifth step of forming a second electrode on the organic layer. The manufacturing method according to Embodiment 3 is identical to that of Embodiment 1 except for the fourth step. Accordingly, only the fourth step of the manufacturing method according to Embodiment 3 will be described.

Figure 11:
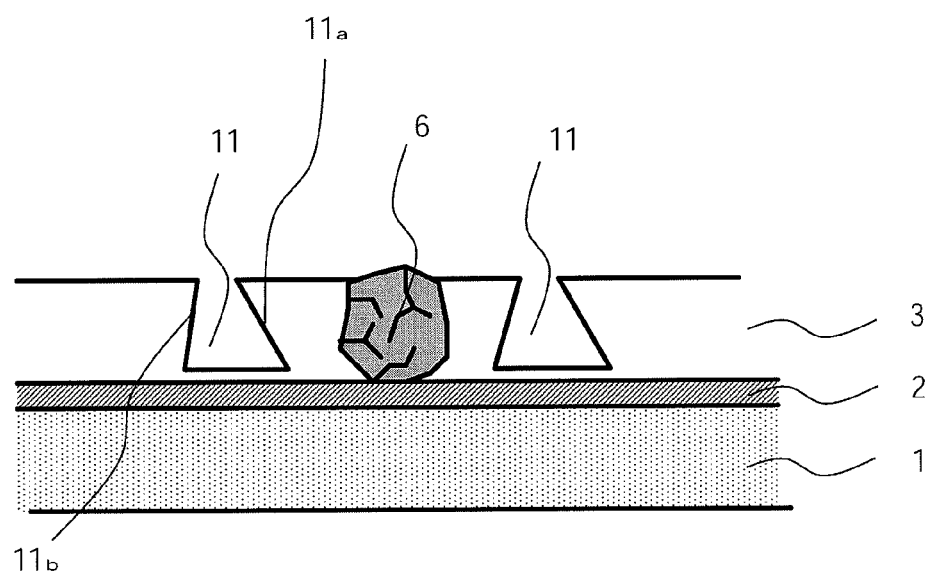
FIG. 11 is a cross-sectional view of a groove that surrounds a foreign substance, the groove formed in an organic layer using the manufacturing method according to Embodiment 3.

In the fourth step of Embodiment 3, a groove which surrounds a foreign substance and has a reverse tapered shape is formed in the organic layer. FIG. 11 is a cross-sectional view of the organic layer after the fourth step of Embodiment 3. As illustrated in FIG. 11, groove 11 surrounding foreign substance 6 has a reverse tapered shape. Herein, the term "reverse tapered groove" means a groove whose opening is smaller in width than the bottom surface.

Formation of such a reverse tapered groove can be achieved by radiating a laser beam at a groove-formation point and changing the inclination angle of the laser beam by inclining the laser beam about the groove-running direction without changing the laser incident position. When a groove surrounding a foreign substance has a reverse tapered shape, electrode materials do not deposit onto wall surfaces 11a and 11b of groove 11 upon formation of the second electrode on the organic layer in the fifth step. It is thus possible to reliably insulate the region surrounded by groove 11.

Figure 12:
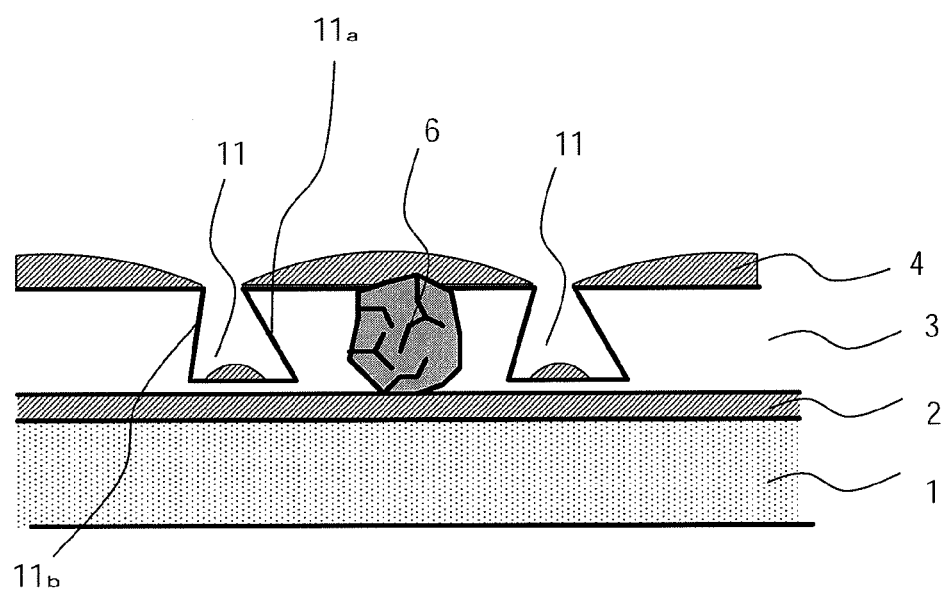
FIG. 12 is a cross-sectional view of a part of an organic EL display in which a foreign substance is introduced, the organic EL display manufactured using the manufacturing method according to Embodiment 3.

FIG. 12 is a cross-sectional view of an organic EL element around a foreign substance after the fifth step. As illustrated in FIG. 12, second electrode 4 is separated by groove 11 from the region surrounded by groove 11. Moreover, materials of the second electrode do not deposit onto wall surfaces 11a and 11b of groove 11. It is thus possible to reliably insulate the region surrounded by groove 11.

As described above, the manufacturing method according to Embodiment 3 can reliably insulate the region surrounded by a groove and thereby can reliably prevent current leakage via a foreign substance.

INDUSTRIAL APPLICABILITY

With a manufacturing method of an organic EL display according to an embodiment of the present invention, it is possible to repair defects like short circuits in organic EL elements caused by foreign substances. Thus, according to the present invention, organic EL displays which are less power consumption by virtue of reduced current leakage, less brightness unevenness and free from organic layer degradation can be manufactured at high yields.

REFERENCE SIGNS LIST

1: substrate
2: first electrode (anode)
3: organic layer
4: second electrode (cathode)
5: protective layer
6: foreign substance
7: bank
8, 10, 11: groove
9: electrode material
12: laser beam
13: laser oscillator
14: electrode-destroyed part

The invention claimed is:

1. A method of manufacturing an organic EL display which comprises a substrate having a TFT therein and a plurality of organic EL elements disposed on the substrate, each of the organic EL elements having a first electrode disposed on the substrate, an organic layer disposed on the first electrode, and a second electrode disposed on the organic layer, the method comprising:
providing the substrate having the TFT therein;
forming the first electrode connected to the TFT on the substrate;
forming the organic layer on the first electrode;
detecting a foreign substance introduced in the organic layer;
forming a groove which surrounds the foreign substance in the organic layer; and
forming the second electrode on the organic layer, the second electrode being separated by the groove from a region surrounded by the groove.

2. The manufacturing method according to claim 1, wherein the depth of the groove is larger than the thickness of the second electrode.

3. The manufacturing method according to claim 1, wherein the width of the groove is larger than the thickness of the second electrode.

4. The manufacturing method according to claim 1, wherein wall surfaces of the groove are perpendicular to the substrate.

5. The manufacturing method according to claim 1, wherein wall surfaces of the groove are inclined with respect to the substrate.

6. The manufacturing method according to claim 1, wherein the groove has a reverse tapered shape.

7. The manufacturing method according to claim 1, wherein the groove is formed by ablating a portion of the organic layer with laser radiation.

8. The manufacturing method according to claim 1, wherein the second electrode is formed by vapor deposition or sputtering.

* * * * *